United States Patent [19]

Howard

[11] Patent Number: 5,067,917
[45] Date of Patent: Nov. 26, 1991

[54] COMPONENT MOUNTING FRAME

[75] Inventor: Jerry L. Howard, Marysville, Wash.

[73] Assignee: Eldec Corporation, Lynnwood, Wash.

[21] Appl. No.: 404,330

[22] Filed: Sep. 6, 1989

[51] Int. Cl.$^5$ ............................................. H01R 13/02
[52] U.S. Cl. .................................... 439/890; 336/65; 336/192; 439/78
[58] Field of Search ............... 336/192, 65; 361/400, 361/403, 404, 405; 439/55, 81, 78, 83, 329, 361, 362, 363, 364, 371, 932, 890; 174/DIG. 8

[56] References Cited

U.S. PATENT DOCUMENTS

| | | | |
|---|---|---|---|
| 2,864,064 | 7/1956 | Heaton | 336/65 |
| 2,953,758 | 9/1960 | Stanwyck | 336/65 |
| 2,965,865 | 12/1960 | Zack | 336/192 |
| 3,332,048 | 7/1967 | Renskers | 336/65 |
| 3,368,276 | 2/1968 | Renskers | 29/625 |
| 3,443,257 | 5/1969 | Mollman | 336/199 |
| 3,524,156 | 8/1968 | Horbach | 336/208 |
| 3,534,309 | 10/1970 | Renskers et al. | 336/65 |
| 3,603,917 | 9/1971 | Owen | 439/697 |
| 3,743,990 | 7/1973 | Renskers et al. | 336/192 |
| 4,234,865 | 11/1980 | Shigehara | 336/192 X |
| 4,396,244 | 8/1983 | Teman | 439/932 X |
| 4,455,544 | 6/1984 | Sibille et al. | 336/65 |
| 4,491,818 | 1/1985 | Danenberg et al. | 336/65 |
| 4,495,480 | 1/1985 | Martin et al. | 336/192 X |
| 4,806,895 | 2/1989 | Petrow | 336/65 |

FOREIGN PATENT DOCUMENTS

| | | | |
|---|---|---|---|
| 8303495 | 10/1983 | European Pat. Off. | 336/65 |
| 0119006 | 5/1989 | Japan | 336/65 |
| 0119007 | 5/1989 | Japan | 336/65 |

Primary Examiner—Neil Abrams
Assistant Examiner—Khiem Nguyen
Attorney, Agent, or Firm—Christensen, O'Connor, Johnson & Kindness

[57] ABSTRACT

A frame (10) for holding an electrical component (34) that is to be mounted on a printed circuit board is provided. A board (12) is folded to form a pocket (20) having sidewalls (22 and 24) and a floor (26). The board is further folded to form flaps (28 and 30) connected to the sidewalls and lying adjacent the sidewalls outside the pocket. A plurality of terminal wires ($14_1$-$14_n$ and $15_1$-$15_n$) are inserted into a plurality of spaced apart hole pairs ($16_1$-$16_n$ and $17_1$-$17_n$) located in the flaps. Ends ($40_1$-$40_n$ and $44_1$-$44_n$) of the terminal wires are connected to lead wires ($36_1$-$36_n$ and $37_1$-$37_n$) of the electrical component contained in the pocket. Other ends ($42_1$-$42_n$) of the terminal wires may be connected to a printed circuit board. The other ends ($42_1$-$42_n$ and $46_1$-$46_n$) are spaced apart a predetermined distance. The terminal wires are made of solid wire and support the board and the electrical element mounted thereto. A heat shrinkable sleeve (50) may be placed over the board and electrical component assembly so as to hold the flaps in position against the sidewalls of the pocket.

27 Claims, 4 Drawing Sheets

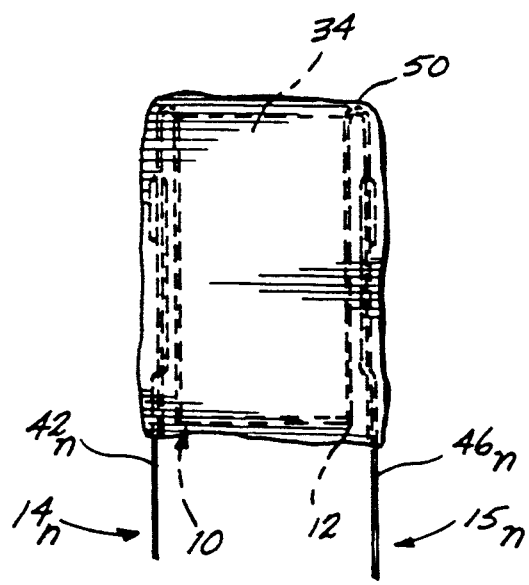
Fig. 3.
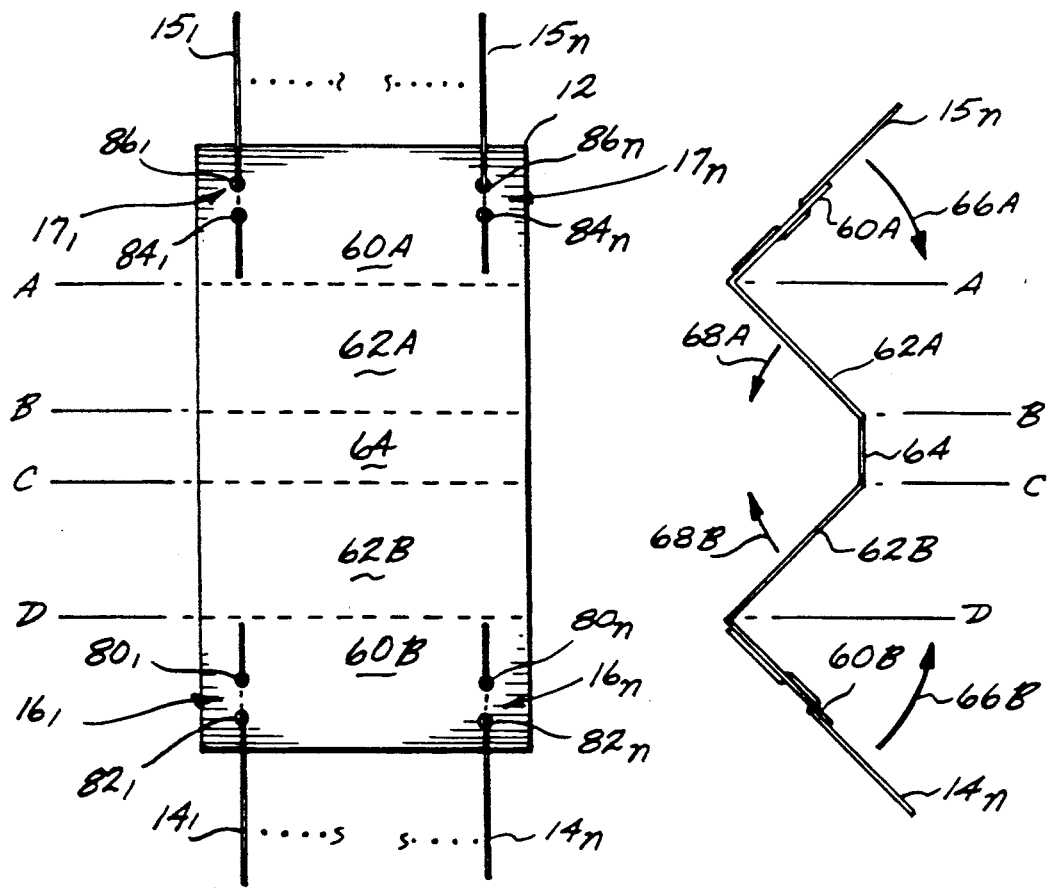
Fig. 4A.
Fig. 4B.

5,067,917

COMPONENT MOUNTING FRAME

FIELD OF THE INVENTION

This invention relates to mounting devices, and more particularly, to frames for mounting electrical components to facilitate their mounting on printed circuit boards.

BACKGROUND OF THE INVENTION

Along with the ongoing push to reduce the physical size of electrical circuits, there has developed a corresponding need to reduce the space required for mounting electrical components on printed circuit boards (PCBs). Some components, such as resistors, are normally mounted directly onto a PCB. Obviously, the mounting space required of such a component is determined, at least in part, by the component's physical size. Accordingly, the required mounting space of such a component is reduced when the physical size of the component is reduced. Other components, such as a transformer or other electromagnetic device, are held by a frame, which forms an assembly that can then be mounted onto a printed circuit board. These devices typically include windings made of very small gauge wire and are relatively heavy. The mounting frames securely hold the devices to the PCB so as to prevent breakage of the small gauge wires. Accordingly, the required mounting space of transformers and transformers and other electromagnetic devices is determined by the physical size of the device as well as by the physical size of the mounting frame. Reducing the size of the device and/or the frame will reduce the mounting space requirements.

The physical size of an electromagnetic device, such as a transformer, is determined in part by the electrical requirements of the transformer, namely, the voltage, current, and power handling requirements. These requirements may limit how small the transformer can be made. However, reduction in the physical size of such a device is not the subject of the present invention.

As noted above, another way by which the required mounting space of a component, such as a transformer or other electromagnetic device, can be reduced, and which does form the subject of the present invention, is by reducing the physical size of the frame used to mount the component to a PCB. In the case of a transformer, as also noted above, the frame supports the transformer and allows the transformer to be securely mounted to the PCB while, at the same time, protecting the small gauge wires used in the windings of the transformer from breaking. The small gauge wire used in the windings also forms the leads of the transformer. One problem associated with the transformer leads is that, if they are directly connected to the PCB, they may be easily broken due to vibration or other movement of the transformer and/or the PCB. Another problem associated with small gauge transformer leads is that the leads are difficult to insert into mounting holes in the PCB. This difficulty arises, in part, because of the flexibility of the small gauge wire and the corresponding small diameter of the mounting holes.

In order to alleviate the above problems associated with mounting electrical components, such as transformers or other electromagnetic devices to PCBs, the small gauge component leads are usually connected to mounting leads, which are made of larger gauge wire. The mounting leads are then connected to the PCB. One prior art technique connects the component leads to larger gauge mounting leads and encapsulates the component and the component and mounting lead connections. The component and the lead connections are typically encapsulated by placing them in a cup or potting mold which is then filled with a suitable encapsulating material and cured to form an integral assembly. Encapsulating both the component and the component and mounting lead connections increases their resistance to breakage from vibration or other mechanical forces. Unfortunately, this prior art technique produces a rather large and heavy assembly that, in most cases, cannot be supported by the mounting leads. Rather, the bottom of the cup is usually affixed directly to the PCB. The mounting leads exit from the top of the cup and turn down to the PCB where they are soldered in place. One problem associated with this prior art technique is that the cap containing the encapsulated component takes up a significant amount of surface area on the PCB. Not only does the cup take up surface area, but additional space is required for the mounting leads. As a result, this prior art technique for mounting components on PCBs forms a relatively large and heavy assembly that takes up a substantial amount of surface area on a printed circuit board.

Other prior art techniques involve mounting a component to a board, or frame, and connecting the component leads to frame leads attached to the board. Typically, the prior art mounting boards are either flat or have a folded configuration that wraps around the component. The component is, in most cases, glued to the mounting board. The component and mounting board assembly may be encapsulated. In any event, the gluing and/or encapsulating steps are required to securely hold the component to the mounting board. Unfortunately, the gluing and encapsulating steps included in this prior art technique are time consuming and add to the manufacturing cost of the assembly.

As can be appreciated from the foregoing discussion, there has developed a need for an inexpensive mounting device that will securely hold an electrical component, such as a transformer or other electromagnetic device so that it can be attached to a printed circuit board while, at the same time, taking up very little space on the printed circuit board. This invention is directed to a component mounting frame that achieves these results.

SUMMARY OF THE INVENTION

In accordance with the present invention, a frame for holding an electrical component that is to be mounted to a printed circuit board is provided. A flat member is folded so as to form a pocket with first and second flaps adjacent the pocket. A first frame lead is inserted into a hole pair in the first flap so as to be securely attached to the first flap and a second frame lead is inserted into a hole pair in the second flap so as to be securely attached to the second flap. A first end of the first and second frame leads may be connected to lead wires from an electrical component mounted in the pocket of the frame. A second end of the first and second frame leads may be connected to a printed circuit board such that the first and second frame leads support the frame and the electrical component mounted thereon.

In accordance with further aspects of the present invention, the first flap includes a first plurality of spaced apart hole pairs and the second flap includes a second plurality at spaced apart hole pairs. Adjacent hole pairs of the first and second plurality of spaced apart hole pairs are horizontally spaced apart a predetermined distance, preferably, an equal distance. A first plurality and a second plurality of frame leads are inserted into the first and second plurality of spaced apart hole pairs, respectively. Accordingly, adjacent frame leads are horizontally spaced a predetermined distance apart. Each of the hole pairs includes vertically spaced apart top and bottom holes. The first ends of the first and second plurality of frame leads extend from the top holes and the second ends of the first and second plurality of frame leads extend from the bottom holes of the first and second plurality of spaced apart hole pairs. The first ends are bent over to further secure the first and second plurality of frame leads to the first and second flaps. A sleeve wrapped around the frame and the electrical component holds the flaps securely in position.

In accordance with alternative aspects of the present invention, the frame includes a flat member folded to form a sidewall and an adjacent flap. The flap includes a plurality of hole pairs. A plurality of frame leads are inserted into the plurality of pairs located in the flap. A first end of the plurality of frame leads may be connected to lead wires from an electrical component mounted to the sidewall. A second end of the plurality of frame leads may be connected to a printed circuit board, such that the plurality of frame leads support the frame and the electrical component mounted thereto. A sleeve wrapped around the frame and the electrical component holds the flap securely in position.

As can be appreciated from the foregoing summary, the invention provides an inexpensive frame for holding and supporting an electrical component, such as a transformer or other electromagnetic device, so as to reduce the required mounting space of the assembly on a printed circuit board. Further, the frame leads have a predetermined spaced relation so as to ease installation of the component and frame assembly on the printed circuit board.

BRIEF DESCRIPTION OF THE DRAWINGS

The foregoing and other features and advantages of the invention will become more readily appreciated as the same becomes further understood by reference to the following detailed description when taken in conjunction with the accompanying drawings, wherein:

FIG. 3 illustrates the frame and transformer assembly depicted in FIGS. 2A and 2B covered by an outer sleeve;

FIGS. 4A and 4B illustrate front and side views of a board suitable for forming the frame depicted in FIGS. 1A and 1B; and, FIGS. 5A and 5B illustrate front and side views of an alternative embodiment of the frame and transformer assembly depicted in FIGS. 2A and 2B.

DESCRIPTION OF THE PREFERRED EMBODIMENT

Figure 1A:
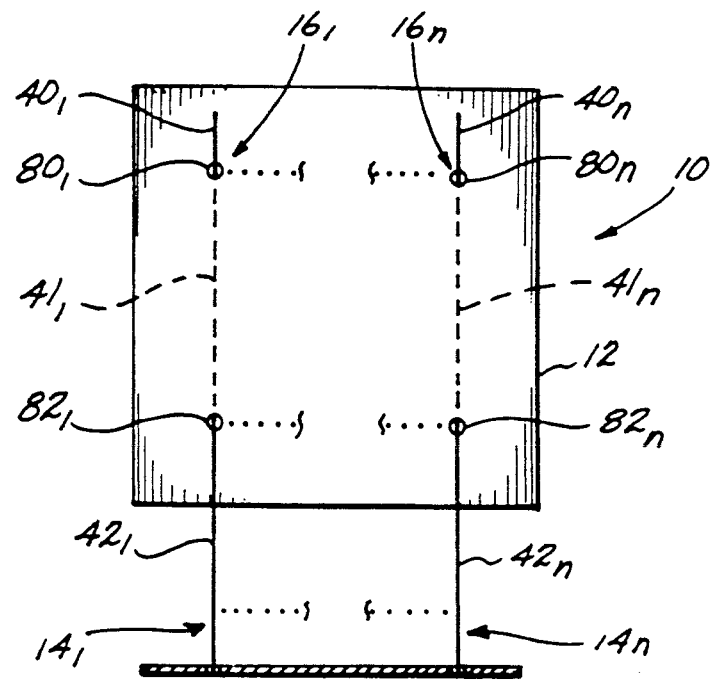
FIGS. 1A and 1B illustrate front and side views of a preferred embodiment of a frame for holding an electrical component and formed in accordance with the present invention.
Figure 1B:
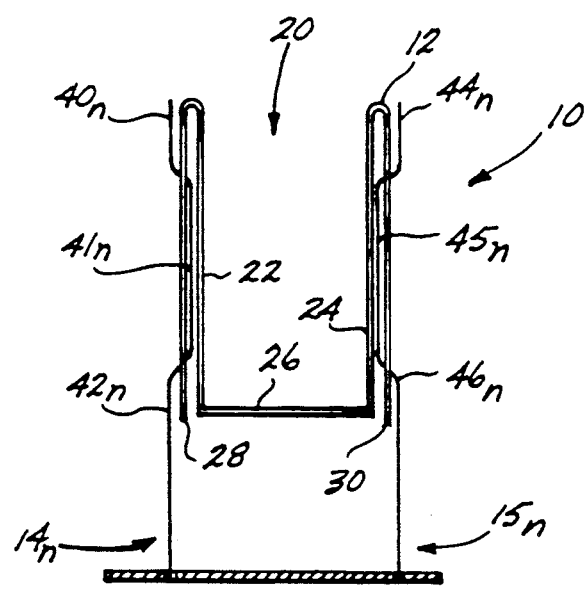

FIGS. 1A and 1B illustrate a frame 10 formed in accordance with the present invention and suitable for holding an electrical component (not shown in FIG. 1) so that the electrical component may be mounted on a printed circuit board 11. Turning first to FIG. 1A, the frame 10 comprises: a folded, flat member, or board 12; a plurality of hole pairs $16_1$–$16_n$; and, a plurality of wires, hereinafter referred to as frame leads $14_1$–$14_n$. The board 12 is preferably made of a substantially rigid material having suitable electrical insulating characteristics. An example of a suitable board material is NOMEX, manufactured by E. I. DuPont de Nemours & Co. As oriented in FIG. 1A, each of the hole pairs $16_1$–$16_n$ consists of two vertically spaced holes $80_1$–$80_n$ and $82_1$–$82_n$. For example, hole pair $16_1$, consists of a top hole $80_1$ and a bottom hole $82_1$. Each of the hole pairs $16_1$–$16_n$ are horizontally spaced from an adjacent hole pair(s). Preferably, each of the hole pairs $16_1$–$16_n$ are horizontally spaced an equal distance from an adjacent hole pair(s) on the board 12. The top holes $80_1$–$80_n$ lie in a row as do the bottom holes $82_1$–$82_n$. Further, the row of top holes $80_1$–$80_n$ is substantially parallel to the row of bottom holes $82_1$–$82_n$.

As oriented in FIG. 1A, each of the frame leads $14_1$–$14_n$ consist of three distinct portions, namely: an upwardly extending portion or top end $40_1$–$40_n$; a middle portion $41_1$–$41_n$; and a downwardly extending portion or bottom end $42_1$–$42_n$. The frame leads $14_1$–$14_n$ are inserted into the corresponding hole pairs $16_1$–$16_n$. Preferably, all of the frame leads $14_1$–$14_n$ are similarly positioned in the corresponding hole pairs $16_1$–$16_n$. For example, as depicted in FIG. 1A, frame lead $14_1$ is inserted through hole pair $16_1$, so that the top end $40_1$ protrudes from the top hole $80_1$ and the bottom end $42_1$ protrudes from the bottom hole $82_1$. Further, as oriented in FIG. 1A, the upwardly and downwardly extending portions $40_1$ and $40_2$ are positioned in front of the board 12. Conversely, the middle portion $41_1$ of the frame lead $14_1$, which is between the top and bottom ends $40_1$ and $42_1$, lies behind the board 12. As further depicted in FIG. 1A, the bottom end $42_1$ of the frame lead $14_1$ is longer than the top end $40_1$. As will become better understood from the following discussion, the top ends $40_1$–$40_n$ of the frame leads $14_1$–$14_n$ are suitable for connecting to leads from an electrical component mounted on the board 12 and the bottom ends $42_1$–$42_n$ are suitable for connecting to a printed circuit board.

In accordance with one physical embodiment of the invention, as best depicted in FIG. 1B, the board 12 is folded to form a pocket 20. More specifically, the board 12 is folded to form parallel sidewalls 22 and 24 and a floor 26 that is substantially perpendicular to the sidewalls 22 and 24. The sidewalls 22 and 24 and the floor 26 form the pocket 20. The board 12 is further folded to form flaps 28 and 30. As oriented in FIG. 1B, the flap 28 is connected to the top of sidwall 22 and is substantially parallel to the sidewall 22. The flap 28 lies adjacent a surface of sidewall 22 outside the pocket 20. Similarly, the flap 30 is connected to the top of sidewall 24 and is substantially parallel to the sidewall 24 and lies adjacent a surface of sidewall 24 outside the pocket 20. As will become better understood from the following discussion, the pocket 20 of the frame 10 is particularly well suited for receiving an electrical component, such as a toroidal transformer or other toroid-shaped electromagnetic component.

The frame leads $14_1$–$14_n$, described above as being connected to the board 12, are further depicted in FIG. 1B as being connected to the flap 28 of the board 12. The frame leads $14_1$–$14_n$ are connected to the flap 28 in the manner described above. That is, the hole pairs $16_1$-$16_n$ reside in the flap 28 and the frame leads $14_1$-$14_n$ are inserted into the hole pairs $16_1$-$16_n$, such that they are securely attached to the flap 28.

As illustratively shown in FIG. 1B and as best shown in FIG. 4A, a second set of frame leads $15_1$-$15_n$ is connected to the board 12, however, only frame lead $15_n$ is shown in the side view of the frame 10 depicted in FIG. 1B. The frame leads $15_1$-$15_n$ are connected to the flap 30 in the same manner that the frame leads $14_1$-$14_n$ are connected to the other flap 28. That is, the frame leads $15_1$-$15_n$ are inserted into a plurality of hole pairs $17_1$-$17_n$ located in the flap 30 (See FIG. 4A). Further, as best shown in FIG. 4A, the hole pairs $17_1$-$17_n$ include top holes $84_1$-$84_n$ vertically spaced from bottom holes $86_1$-$86_n$. Preferably, as with the hole pairs $16_1$-$16_n$ discussed above, the hole pairs $17_1$-$17_n$ are equally spaced horizontally and the top and bottom holes $84_1$-$84_n$ and $86_1$-$86_n$ are equally spaced vertically to form parallel rows of holes. Similarly, the frame leads $15_1$-$15_n$ include top ends $44_1$-$44_n$, middle portions $45_1$-$45_n$ and bottom ends $46_1$-$46_n$. Since, as noted above, the frame leads $15$-$15_n$ are connected to the flap 30 in the same manner as the frame leads $14_1$-$14_n$ are connected to the flap 28, these connections are not repeatedly discussed herein.

The frame leads $14_1$-$14_n$ and $15_1$-$15_n$ are preferably solid wires having sufficient strength to support the frame 10 and an electrical component held by the frame 10 (not shown in FIGS. 1A and 1B). The frame 10 and the electrical component held thereby, form an assembly that is substantially lighter and more compact than component/holder assemblies found in the prior art, such as cup and encapsulated component assemblies. Accordingly, since the assembly is lighter, the frame leads $14_1$-$14_n$ and $15_1$-$15_n$ may be a smaller gauge and, thus, lighter than the frame leads used in the prior art. Because of the lighter weight of the frame 10 and electrical component assembly, the assembly may be supported by the frame leads $14_1$-$14_n$ and $15_1$-$15_n$. Accordingly, only the bottom ends $82_1$-$82_n$ and $86_1$-$86_n$ of the frame leads $14_1$-$14_n$ and $15_1$-$15_n$ are attached to the printed circuit board 11. Since the board 12 and the transformer or other electrical element held by the frame 10 are not directly attached to the printed circuit board 11, the required mounting space is reduced.

As noted above, and further illustrated in FIG. 4A, the hole pairs $16_1$-$16_n$ and $17_1$-$17_n$ for frame leads $14_1$-$14_n$ and $15_1$-$15_n$, respectively, are, preferably, equally spaced. As a result, the frame leads $14_1$-$14_n$ and $15_1$-$15_n$ are also equally spaced. The equal spacing of the frame leads $14_1$-$14_n$ and $15_1$-$15_n$ is further aided by the fact that the frame leads are made of solid wire, as opposed to stranded wire, which is more flexible than solid wire of the same gauge. The inherent stiffness of solid wire permits the frame leads $14_1$-$14_n$ and $15_1$-$15_n$ to, more readily, retain their equal spacing. As is readily apparent to a person of ordinary skill in printed circuit board (PCB) technology, maintaining a predetermined spacing between the frame leads allows easier prefabrication of the PCB. That is, mounting holes in the PCB for the frame leads may be predrilled at this predetermined spacing so that the frame leads may be quickly and easily inserted therein. When stranded wire is used for the frame leads, as is the case in many prior art techniques, a predetermined spacing between the frame leads is difficult to maintain due to the inherent flexibility of the stranded wire. As a result, fast and efficient insertion of such prior art frame leads into predrilled holes in a PCB is difficult to achieve.

Figure 2A:
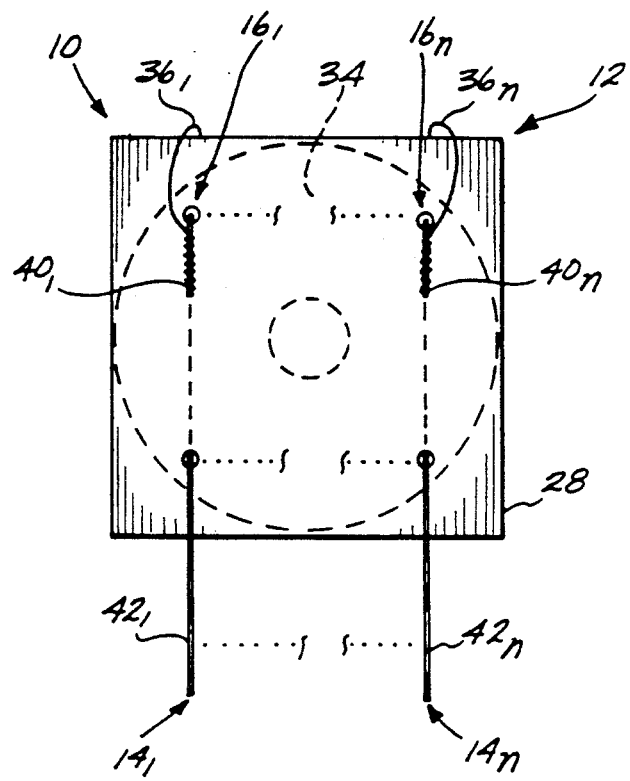
FIGS. 2A and 2B illustrate front and side views of the frame depicted in FIGS. 1A and 1B with a toroidal transformer mounted therein.
Figure 2B:
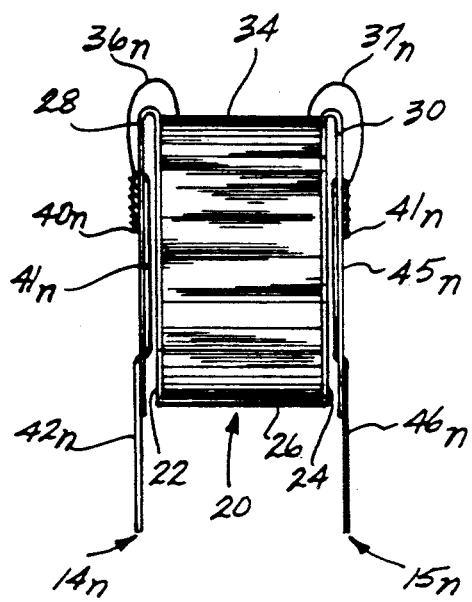

Turning now to FIGS. 2A and 2B, there is depicted an electrical component 34 mounted on the frame 10 discussed above. The particular electrical component 34 shown in FIGS. 2A and 2B is a toroid-shaped element, such as a toroidal transformer. It is to be understood, however, that other electrical components (including those with non-toroidal shapes) may also be mounted on the frame 10. The transformer 34 is placed in the pocket 20 of the frame 10. As best depicted in FIG. 2A, the transformer has a plurality of lead wires $36_1$-$36_n$. The lead wires $36_1$-$36_n$ are brought out from an open end (i.e., the top) of the pocket 20 and connected to the frame leads $14_1$-$14_n$, respectively. More specifically, the lead wires $36_1$-$36_n$ are connected to the top ends $40_1$-$40_n$ of the respective frame leads $14_1$-$14_n$. Although not depicted in FIG. 2A, and only illustratively shown in FIG. 2B, the transformer 34 may include a second plurality of lead wires $37_1$-$37_n$. As representatively illustrated by lead wire $37_n$ in FIG. 2B, the lead wires $37_1$-$37_n$ are connected to the frame leads $15_1$-$15_n$ in the same manner that the lead wires $36_1$-$36_n$ are connected to the frame leads $14_1$-$14_n$, discussed above. That is, the lead wires $37_1$-$37_n$ are connected to the top ends $44_1$-$44_n$ of the respective frame leads $15_1$-$15_n$. Preferably, the lead wires are wrapped around the frame leads and soldered in place.

As shown in FIGS. 2A and 2B, the upwardly extending top ends $40_1$-$40_n$ and $44_1$-$44_n$ are bent downward. Preferably, the ends are bent downward after the lead wires have been connected thereto. The downward bending of the ends $40_1$-$40_n$ and $44_1$-$44_n$ further secures the frame leads $14_1$-$14_n$ and $15_1$-$15_n$ to the board 12. Thus, by securely connecting the lead wires $36_1$-$36_n$ and $37_1$-$37_n$ from the transformer 34 to the frame leads $14_1$-$14_n$ and $15_1$-$15_n$ of the frame 10 and by securing the frame leads to the board 12, the need to encapsulate the frame 10 and transformer 34 assembly in order to secure these connections is eliminated. As a result, the size and weight of the assembly can be reduced from the size and weight of comparable assemblies in the prior art.

In addition to the above connections, it may be desirable to securely hold the flaps 28 and 30 tight against the sidewalls 22 and 24 of the pocket 20. FIG. 3 illustrates how this may be accomplished with a sleeve 50 that is placed around the board 12, a portion of the frame leads $14_1$-$14_n$ and $15_1$-$15_n$ and, the transformer 34. Preferably, the sleeve 50 is made of a heat-shrinkable material that can be shrunk after it is placed around the assembly. Once the sleeve 50 is shrunk, it holds the flaps 28 and 30 tight against the sidewalls 22 and 24. The sleeve 50 depicted in FIG. 3 is open at the bottom and may or may not be open at the top. In one physical embodiment of the invention, both the top and bottom of the sleeve 50 are open. The bottom ends $42_1$-$42_n$ and $46_1$-$46_n$ of the frame leads $14_1$-$14_n$ and $15_1$-$15_n$ protrude from the bottom of the sleeve 50 a sufficient distance to permit their connection to a printed circuit board (not shown). The sleeve 50 may also be in the form of tape or other suitable material that holds the flaps 28 and 30 in position.

Securing the flaps 28 and 30 with the sleeve 50 increases the ruggedness of the assembly, since the flaps 28 and 30 will be prevented from moving relative to the pocket 20. The secured flaps 28 and 30 also make it easier to insert the frame and transformer assembly onto a printed circuit board. Further, the sleeve 50 maintains the frame in its most compact configuration, which allows the assembly to take up as little space as possible on the printed circuit board.

FIGS. 4A and 4B illustrate one manner of folding the board 12 to form the frame 10 depicted in FIGS. 1A and 1B. The board 12 is rectangular, having a height substantially greater than its width. As oriented in FIG. 4A, the height of the board 12 is oriented vertically and the width of the board 12 is oriented horizontally. The board 12 has four horizontal creases about which it is folded. These creases are depicted by horizontal, dashed lines, denoted A, B, C, and D from top to bottom. The creases, hereinafter referred to as crease A, crease B, crease C, and crease D, are parallel to one another. The section of the board 12 defined by the crease A and a top edge of the board 12 forms an end section 60A. Similarly, the portion of the board 12 defined by the crease D and a bottom edge of the board 12 forms an end section 60B. Sections of the board 12 defined on either end by creases A and B and by creases C and D form side sections 62A and 62B, respectively. Lastly, the section of the board 12 defined by creases B and C forms a center section 64. As will become better understood with the discussion of FIG. 2B below, the sections of the board 12 discussed above and depicted in FIG. 2A, form the various parts of the frame 10 depicted in FIG. 1B and discussed above.

The frame 10 depicted in FIG. 1B is formed by folding the board 12 along creases A, B, C, and D as indicated by fold arrows 66A, 66B, 68A, and 68B in FIG. 4B. FIG. 4B shows the board 12 partially folded in this manner. By continuing to fold the board 12 in the direction of the fold arrows, the frame 10 depicted in FIG. 1B is obtained. Accordingly, end sections 60A and 60B form the flaps 28 and 30, respectively. Similarly, side sections 62A and 62B and center section 64 form the sidewalls 22 and 24 and the floor 26 of the pocket 20, respectively.

Figure 5A:
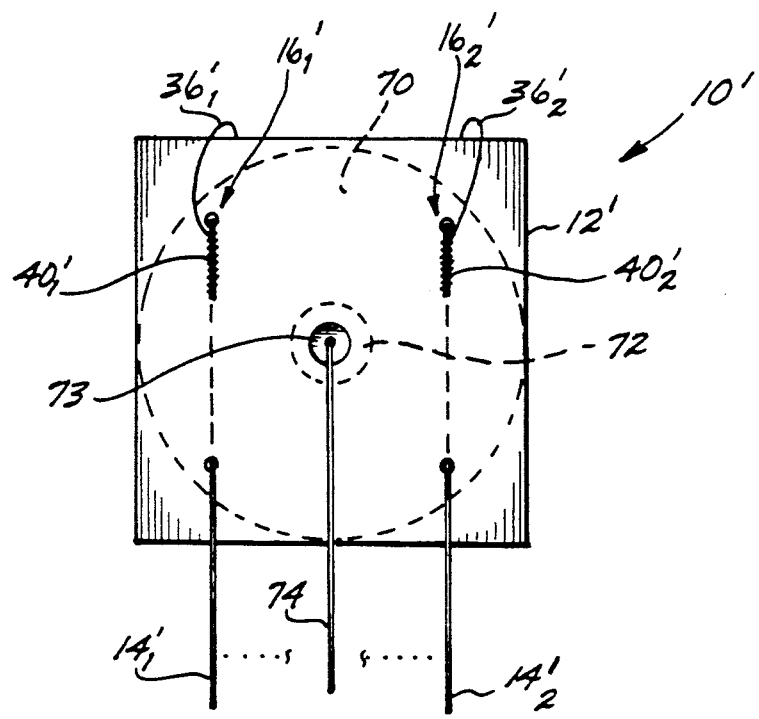
Figure 5B:
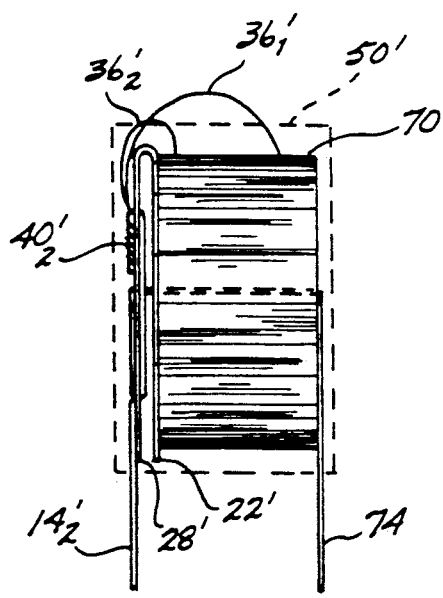

FIGS. 5A and 5B illustrate an alternative embodiment of the frame 10. In particular, FIGS. 5A and 5B illustrate a frame 10' formed in accordance with the present invention and suitable for holding a current sensing, toroidshaped transformer 70. In this alternative embodiment, a board 12' is folded to form a single sidewall 22' and a single flap 28'. Frame leads $14'_1$ and $14'_2$ are inserted into hole pairs $16'_1$ and $16'_2$ in the flap 28'. The current transformer 70, or other device, is placed against the side 22', facing away from the flap 28'. Lead wires $36'_1$ and $36'_2$ from the current transformer 70 are connected to top ends $40'_1$ and $40'_2$ of the frame leads $14'_1$ and $14'_2$. Preferably, these connections are secured by soldering the lead wires $36'_1$ and $36'_2$ to the top ends $40'_1$ and $40'_2$. The frame leads $14'_1$ and $14'_2$ are further anchored to the board 12' by downwardly bending the top ends $40'_1$ and $40'_2$.

In one physical embodiment, the board 12' has holes 72 and 73 located substantially in the center of the sidewall 22' and the flap 28', respectively. In the embodiment depicted in FIG. 5A, the holes 72 and 73 are coaxial and have the same diameter. Accordingly, only the hole 73 in the flap 28 is shown in FIG. 5A. A current carrying conductor 74 passes through the holes 72 and 73 and through the center hole of the current sensing transformer 70 so that the transformer 70 may sense the current in the conductor 74. The conductor 74 may or may not be secured to the frame 10'. It is to be understood that if a device other than a current transformer is mounted to the frame 10', the holes 72 and 73 may not be needed. Hence, depending upon the particular application, the frame 10' may or may not have the center holes 72 and 73.

Bottom ends $42'_1$ and $42'_2$ of the frame leads $14'_1$ and $14'_2$ may be connected to a printed circuit board (not shown), such that the frame leads $14'_1$ and $14'_2$ support the frame 10' and the current transformer 70 mounted thereto.

As an aid to the fabrication of the assembly illustrated in FIGS. 5A and 5B, the current transformer 70 may be bonded to the sidewall 22' by an appropriate adhesive (not shown). If desired, the entire assembly may be further held together by a heat-shrinkable sleeve 50', (or tape, for example) depicted by a dashed outline in FIG. 5B. The sleeve 50', if used, holds the flap 28' in a fixed relation to sidewall 22'. Where the sleeve 50' is used, it is to be understood that the current transformer 70 may be adequately held in place against the board 12' without the use of an adhesive.

The board 12' depicted in FIGS. 5A and 5B may be formed from the board 12 depicted in FIG. 4A. More specifically, two (or more) boards 12' may be obtained from one board 12. Referring to FIG. 4A, the board 12 may be cut along creases B and C and the center section 64 removed so as to divide the board 12 into two separate pieces defined by sections 60A and 62A and by sections 60B and 62B. Folding one piece along crease A and the other piece along crease D produces two of the boards 12' depicted in FIGS. 5A and 5B and discussed above. Further, additional boards may be obtained by cutting the boards 12' along a line (not shown in FIG. 4A) between hole pairs $14_1$-$14_n$ and $17_1$-$17_n$ and perpendicular to the crease lines.

The frame 10' illustrated in the alternative embodiment of the invention depicted in FIGS. 5A and 5B is particularly well suited for holding electrical components having few lead wires such as current sensing transformers. As discussed above, a current sensing transformer or other toroid-shaped transformer having two leads may be mounted to the board 12' as illustrated in FIG. 5A. A component having additional lead wires, for example, a third and fourth lead wire (not shown), may be mounted to the board 12'. The third and fourth lead wires may be similarly connected to third and fourth frame leads $14_3'$ and $14_4'$ (also not shown). Contrariwise, the frame 10 depicted in FIGS. 1B and 2B, is particularly well suited for holding electrical components having more than four lead wires. In one physical embodiment of the frame 10, the board 12 contains 18 hole pairs (i.e., 9 in each flap 28 and 30), and, thus, is suitable for holding a component having as many as 18 lead wires. One feature of the present invention is that the board 12' of the alternative embodiment (FIGS. 5A and 5B) does not require any additional tooling over that required to fabricate the board 12 in the preferred embodiment of the invention (FIGS. 1A and 1B). As noted above, the board 12 is merely cut into pieces to form two, or more, of the boards 12'.

As can be readily appreciated from the foregoing description, the invention provides an inexpensive frame for holding electrical components, such as toroid-shaped transformers, for mounting to a printed circuit board. Further, the frame and transformer assembly requires very little space when mounted on a printed circuit board. While preferred and alternative embodiments of the invention have been illustrated and described herein, it is to be understood that, within the scope of the appended claims, various changes can be made. For example, the board could be made out of a material other than NOMEX, the board can have a shape other than rectangular, and, the pocket formed by the folded board could have a shape other than the rectangular shape discussed above, such as a V or U shape. The predetermined spacing between hole pairs in the board may not be equal. Likewise, there may be frame leads in less than all of the hole pairs, which may cause unequal spacing between the frame leads. Further, the number of hole pairs and frame leads may differ from that discussed above. Other changes can also be made. Hence, it is to be understood that the invention can be practiced otherwise than as specifically described herein.

The embodiments of the invention in which an exclusive property or privilege is claimed are defined as follows:

1. A frame for holding an electrical component that is to be mounted on a printed circuit board, said frame comprising:
   (a) a flat member having at least two hole pairs and folded to form a pocket for holding an electrical component therein, said flat member being further folded to form a first flap adjacent said pocket and having one of said hole pairs located therein and a second flap adjacent said pocket and having another one of said hole pairs located therein; and,
   (b) a first frame lead and a second frame lead attached to said flat member, said first frame lead being inserted through said hole pair in said first flap so as to securely attach said first frame lead to said first flap and said second frame lead being inserted through said hole pair in said second flap so as to securely attach said second frame lead to said second flap, said first and second frame leads having first ends that may be connected to lead wires from the electrical component in said pocket and second ends that may be connected to a printed circuit board, such that said first and second frame leads support said frame and the electrical component held in said pocket of said frame.

2. The frame of claim 1, wherein said pocket includes:
   (a) a first sidewall having a top and a bottom;
   (b) a second sidewall having a top and a bottom; and,
   (c) a floor joining said bottom of said first sidewall and said bottom of said second sidewall.

3. The frame of claim 2, wherein said first sidewall is substantially parallel to said second sidewall and said floor is substantially perpendicular to said first and second sidewalls.

4. The frame of claim 2, wherein said first flap is formed by folding said flat member at the top of said first sidewall such that said first flap is adjacent said first sidewall, and said second flap is formed by folding said flat member at the top of said second sidewall such that said second flap is adjacent said second sidewall.

5. The frame of claim 4, wherein said first and second flaps are outside said pocket.

6. The frame of claim 5, wherein said first flap and said second flap are held in position by a sleeve that wraps around said frame.

7. The frame of claim 6, wherein said sleeve is made of heat shrinkable material.

8. The frame of claim 1, wherein said flat member is made of substantially rigid, electrically insulating material.

9. A frame for holding an electrical component that is to be mounted on a printed circuit board, said frame comprising:
   (a) a flat member folded to form a pocket for holding an electrical component therein, said flat member being further folded to form:
      (i) a first flap adjacent said pocket having a first plurality of spaced apart hole pairs located therein; and,
      (ii) a second flap adjacent said pocket having a second plurality of spaced apart hole pairs located therein; and,
   (b) a first plurality of frame leads and second plurality of frame leads attached to said flat member, each of said first plurality of frame leads being inserted through one of said first plurality of spaced apart hole pairs so as to securely attach said first plurality of frame leads to said first flap and each of said second plurality of frame leads being inserted through one of said second plurality of spaced apart hole pairs so as to securely attach said second plurality of frame leads to said second flap, said first and second plurality of frame leads having first ends that may be connected to lead wires from the electrical component in said pocket and second ends that may be connected to a printed circuit board, such that said first and second plurality of frame leads support said frame and the electrical component held in said pocket of said frame.

10. The frame of claim 9, wherein adjacent pairs of said first plurality of spaced apart hole pairs are equally spaced apart along a horizontal dimension and adjacent pairs of said second plurality of spaced apart hole pairs are equally spaced apart along a horizontal dimension.

11. The frame of claim 10, wherein each of said first plurality of spaced apart hole pairs and each of said second plurality of spaced apart hole pairs are formed by vertically spaced apart top and bottom holes.

12. The frame of claim 9, wherein adjacent leads of said first plurality of frame leads are spaced apart a predetermined distance along a horizontal dimension and adjacent leads of said second plurality of frame leads are spaced apart a predetermined distance along a horizontal dimension.

13. The frame of claim 12, wherein said adjacent leads of said first plurality of frame leads and said adjacent leads of said second plurality of frame leads are equally spaced apart along the horizontal dimension.

14. The frame of claim 9, wherein said first and second plurality of frame leads are made of solid wire.

15. The frame of claim 14, wherein said first ends of said first and second plurality of frame leads are bent over to further secure said first and second plurality of frame leads to said flat member.

16. A frame for holding an electrical component that is to be mounted on a printed circuit board, said frame comprising:
   (a) a flat member folded to form a sidewall and an adjacent flap, said flap having a plurality of spaced apart hole pairs located therein; and,
   (b) a plurality of frame leads attached to said flat member, each said plurality of frame leads being inserted through one of said plurality of hole pairs so as to securely attach said plurality of frame leads to said flap, said frame leads having first ends that may be connected to lead wires from an electrical component mounted to said sidewall and second ends that may be connected to a printed circuit board, such that said plurality frame leads support said frame and the electrical component mounted thereto.

17. The frame of claim 16, wherein said flat member is made of substantially rigid, electrically insulating material.

18. The frame of claim 16, wherein adjacent pairs of said plurality of spaced apart hole pairs are horizontally spaced apart.

19. The frame of claim 18, wherein said adjacent pairs of said plurality of spaced apart hole pairs are equally spaced apart along a horizontal dimension.

20. The frame of claim 18, wherein each one of said plurality of spaced apart hole pairs includes vertically spaced apart top and bottom holes.

21. The frame of claim 16, wherein adjacent leads of said plurality of frame leads are spaced apart a predetermined distance along a horizontal dimension.

22. The frame of claim 21, wherein said adjacent leads of said plurality of frame leads are equally spaced apart along a horizontal dimension.

23. The frame of claim 16, wherein said plurality of frame leads are made of solid wire.

24. The frame of claim 23, wherein said first ends of said plurality of frame leads are bent over to further secure said frame leads to said board.

25. The frame of claim 16, wherein said sidewall and said flap are held in place by a sleeve wrapped around said frame.

26. The frame of claim 25, wherein said sleeve is made of heat shrinkable material.

27. The frame of claim 14, wherein said flat member is made of substantially rigid, electrically insulating material.

* * * * *

UNITED STATES PATENT AND TRADEMARK OFFICE
CERTIFICATE OF CORRECTION

PATENT NO. : 5,067,917
DATED : November 26, 1991
INVENTOR(S) : J.L. Howard

It is certified that error appears in the above-identified patent and that said Letters Patent is hereby corrected as shown below:

| COLUMN | LINE | ERROR |
| --- | --- | --- |
| 1 | 29-30 | after "transformers" delete "and transformers" |
| 4 | 44 | "circuit board" should be --circuit board 11-- |
| 7 | 42 | "toroidshaped" should be --toroid-shaped-- |
| 10 | 59 | after "each" insert --of-- |
| 10 | 66 | after "plurality" insert --of-- |

Signed and Sealed this

Sixteenth Day of March, 1993

*Attest:*

STEPHEN G. KUNIN

*Attesting Officer*     *Acting Commissioner of Patents and Trademarks*